(12) United States Patent
Caggegi et al.

(10) Patent No.: US 10,084,446 B2
(45) Date of Patent: Sep. 25, 2018

(54) DRIVER CIRCUIT, CORRESPONDING INTEGRATED CIRCUIT AND DEVICE

(71) Applicant: STMicroelectronics S.R.L., Agrate Brianza (IT)

(72) Inventors: Giovanni Caggegi, Cornaredo (IT); Francesco Pulvirenti, Acireale (IT); Giuseppe Cantone, Bareggio (IT); Vincenzo Palumbo, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 29 days.

(21) Appl. No.: 15/163,142

(22) Filed: May 24, 2016

(65) Prior Publication Data

US 2017/0141775 A1 May 18, 2017

(30) Foreign Application Priority Data

Nov. 18, 2015 (IT) .................. 102015000073852

(51) Int. Cl.
| | |
|---|---|
| *H03K 17/687* | (2006.01) |
| *H01L 29/78* | (2006.01) |
| *H03K 5/24* | (2006.01) |
| *H03K 17/0412* | (2006.01) |
| *H03K 17/06* | (2006.01) |
| *H03K 17/74* | (2006.01) |

(52) U.S. Cl.
CPC ....... *H03K 17/687* (2013.01); *H01L 29/7816* (2013.01); *H03K 5/24* (2013.01); *H03K 17/04123* (2013.01); *H03K 17/063* (2013.01); *H03K 17/74* (2013.01); *H03K 2017/066* (2013.01)

(58) Field of Classification Search
CPC ....... H03K 19/00361; H03K 19/00315; H03K 19/00384; H04L 25/028; H04L 25/0272
USPC .................. 327/108, 112, 427, 434
See application file for complete search history.

(56) References Cited

U.S. PATENT DOCUMENTS 5,204,809 A * 4/1993 Andresen .................. H02P 7/04
363/132
5,883,547 A 3/1999 Diazzi et al.
(Continued)

FOREIGN PATENT DOCUMENTS

| EP | 0 743 752 A1 | 11/1996 |
| WO | 94/27370 A1 | 11/1994 |

*Primary Examiner* — Quan Tra
(74) *Attorney, Agent, or Firm* — Seed IP Law Group LLP

(57) ABSTRACT

A circuit provides a high-voltage low-drop diode-like conductive path between a DC voltage supply terminal and a bootstrap terminal in charging a supply capacitor for driving a power switch with the capacitor set between the bootstrap terminal and an output terminal alternatively switchable between a low voltage and a high voltage DC voltage. In an embodiment, the circuit includes first and second transistors such as LDMOS depletion transistors with the first transistor set in a cascode arrangement between the bootstrap terminal and the DC voltage supply terminal and the second transistor coupled with a sense comparator for comparing the voltage at the bootstrap terminal with the voltage at said DC voltage supply terminal. The first and second transistors have common control terminals coupled with the DC voltage supply terminal and common coupling terminals to the bootstrap terminal.

20 Claims, 3 Drawing Sheets

(56) References Cited

U.S. PATENT DOCUMENTS

| | | | |
|---|---|---|---|
| 6,031,412 A | 2/2000 | Genova et al. | |
| 6,060,943 A * | 5/2000 | Jansen | H03K 17/063 |
| | | | 327/493 |
| 6,060,948 A | 5/2000 | Tarantola et al. | |
| 6,075,391 A | 6/2000 | Tarantola et al. | |
| 6,353,345 B1 * | 3/2002 | Yushan | H03K 17/6871 |
| | | | 326/80 |
| 7,190,207 B2 * | 3/2007 | Chen | H03K 17/063 |
| | | | 327/365 |
| 7,215,189 B2 | 5/2007 | Wilhelm | |
| 8,907,705 B2 | 12/2014 | Huang et al. | |
| 9,484,913 B2 * | 11/2016 | Baranwal | H03K 17/689 |
| 2006/0017466 A1 | 1/2006 | Bryson | |
| 2007/0236283 A1 * | 10/2007 | Locatelli | H03K 17/063 |
| | | | 327/589 |
| 2007/0273431 A1 * | 11/2007 | Sakurai | H02M 3/07 |
| | | | 327/537 |
| 2011/0018613 A1 | 1/2011 | Wang | |
| 2011/0284862 A1 | 11/2011 | Zhang | |
| 2014/0049293 A1 | 2/2014 | Mallikarjunaswamy | |

* cited by examiner

DRIVER CIRCUIT, CORRESPONDING INTEGRATED CIRCUIT AND DEVICE

BACKGROUND

Technical Field

The description relates to driver circuits.

One or more embodiments may relate to driver circuits for use, e.g., in high-voltage half-bridge switching circuits.

Description of the Related Art

High-voltage (HV) half-bridge switching circuits may be used in various applications such as, e.g., motor drives, electronic ballasts for fluorescent lamps and power supplies. Such a half-bridge circuit may employ a pair of totem-pole-connected switching elements (e.g., power MOSFETs, IGBTs, FET and GaN devices) placed across a HV rail DC voltage power supply.

In view of the variety of possible applications, continuous improvement of driver circuits is pursued.

BRIEF SUMMARY

One or more embodiments are directed to a driver circuit having the features set forth in the following disclosure.

One or more embodiments may also relate to a corresponding integrated circuit and a corresponding device (e.g., a high-voltage half-bridge switching circuit).

The claims form an integral part of the disclosure of one or more embodiments as provided herein.

One or more embodiments may include a circuit for capacitance charging by means of, e.g., integrated high-voltage depletion transistors, controlled in such a manner as to act as a high-voltage and ultra-low (forward) voltage drop diode.

One or more embodiments may include MOS depletion transistors (such as, e.g., laterally diffused metal oxide semiconductor or LDMOS) as such transistors.

In one or more embodiments, such transistors may be integrated in an isolating well pocket, which sustains the high voltage stress between the high voltage supply and the integrated circuit ground potential.

In one or more embodiments, an equivalent bootstrap diode circuit may include a first (e.g., high-voltage LDMOS depletion) transistor, which may act as a high voltage cascode device, and a second (e.g., high-voltage LDMOS depletion) transistor, which may act as a decoupler transistor for a low voltage sense comparator, the two transistors having gates, bodies and drains in common but different source terminals.

In one or more embodiments, the transistor drains may be coupled with a high-side supply node, while gates may be coupled directly with a low-side supply node; a body polarization circuit, coupled with the bodies of the transistors, may be used, e.g., to avoid switch-on of LDMOS intrinsic bipolar transistors in various application conditions.

In one or more embodiments, the source of a first transistor may be connected to a low-side supply node by means of a low-voltage switch, with such a switch controlled by a logic signal active during the phase in which the low-side gate drive signal is high and the drain of a second transistor is low in comparison to the low-side voltage supplies.

BRIEF DESCRIPTION OF THE SEVERAL VIEWS OF THE FIGURES

One or more embodiments will now be described, by way of example only, with reference to the annexed figures, wherein.

DETAILED DESCRIPTION

Figure 1:
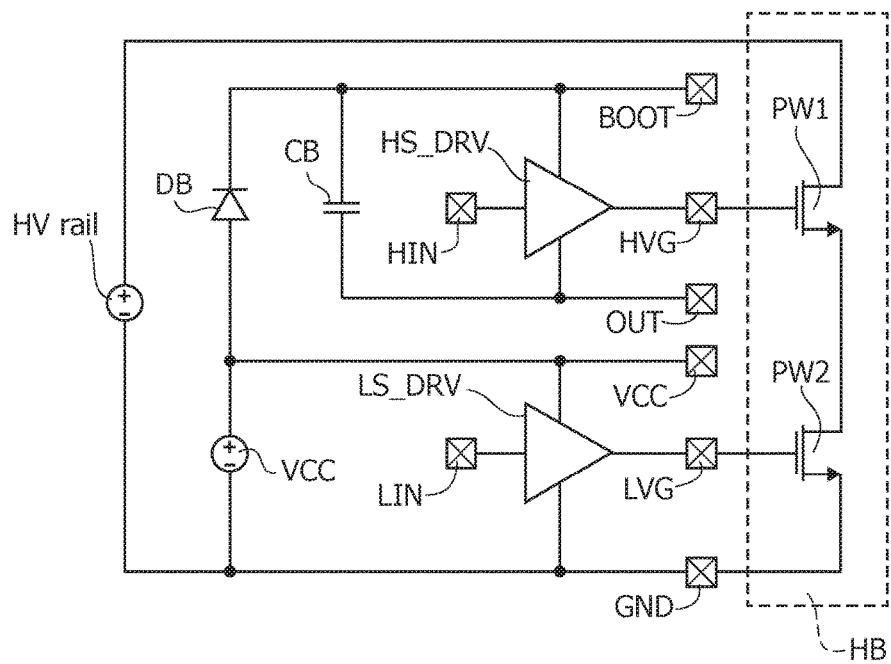
FIG. 1 is a schematic representation of a half-bridge switching circuit.

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

High voltage half-bridge switching circuits may be used in various applications such as motor drives, electronic ballasts for fluorescent lamps and power supplies.

Documents such as, e.g., U.S. Pat. No. 5,883,547 A (to which EP 0 743 752 B1 corresponds), U.S. Pat. No. 6,031,412 A, U.S. Pat. No. 6,060,948 A, U.S. Pat. No. 6,075,391 A, and WO 94/27370 A1 are generally exemplary of the related art.

A half-bridge circuit may employ a pair of totem-pole connected switching elements (e.g., Power MOSFET, IGBTs, FET and GaN devices) that are placed across a high-voltage (HV) rail DC voltage power supply.

For example, a conventional half-bridge switching circuit may include:

first and second power transistors, coupled with each other in a totem pole configuration at a load node, e.g., with the source of the first transistor and the drain of the second transistor interconnected at the load node;

a HV rail DC voltage source, electrically connected to the drain of the first transistor and the source of the second transistor;

gate drive buffers electrically coupled to the gates of the transistors, in order to supply control signals to turn the transistors on and off; and DC voltage supplies in order to provide electrical power to the power devices.

In operating conditions, the transistors in the pair are controlled "diametrically" (namely, are switched on and off alternatively) so that they are not turned on at the same time. In this manner, the voltage at the load node (that is, the output node connected to the load) is not fixed, but may be brought to either the voltage level of the HV rail DC voltage source or to zero volts, depending on which one of the two transistors is turned on at a given instant.

A bootstrap technique may be used to derive a DC voltage supply which is floating with respect to the HV rail DC voltage source.

The block diagram of FIG. 1 is exemplary of such an approach.

In the diagram of FIG. 1, a half-bridge arrangement HB may include a first power switch PW1 and a second power switch PW2 (e.g., power transistors such as power MOSFETs) coupled in a totem pole configuration with the source of the first transistor PW1 and the drain of the second transistor PW2 interconnected at a load node OUT and a HV rail DC voltage source electrically connected to the drain of the first transistor and the source of the second transistor. Gate drive buffers HS_DRV (high-side) and LS_DRV (low-side), driven by respective high-side and low-side control signals HIN and LIN, are coupled (e.g., at HVG and LVG) to the gates (control electrodes) of the transistors PW1, PW2 in order to supply control signals to turn the transistors on and off.

In one or more embodiments a high-voltage diode DB may connected between a DC voltage supply VCC and a BOOT voltage pin. The diode DB and a capacitor CB may then be used to derive from the LS_DRV voltage supply (VCC) a HS_DRV voltage supply (VBO) which floats with respect to the HV rail DC voltage source.

When the second transistor PW2 is turned on, the load node OUT is effectively connected to a low voltage (e.g., zero volts—ground GND) and the high-voltage diode DB allows current to flow from the DC power supply (VCC) to the capacitor CB, thereby charging the capacitor to approximately the voltage level of the DC power supply. When the second transistor PW2 is turned off and the first transistor PW1 is turned on, the voltage at the load node OUT assumes approximately the voltage level of the HV rail DC voltage supply, which causes the diode DB to be reverse-biased, with no current flowing from the DC power supply to the capacitor CB. While the diode DB remains reverse biased, the charge stored in the capacitor supplies the buffer HS_DRV. However, the capacitor CB is in a position to supply such voltage only for a finite amount of time, so that the first transistor PW1 is turned off and the second transistor PW2 turned on in order to restore the charge on the capacitor CB.

In integrated circuits comprising output stages for driving discrete power devices or integrated in a same chip containing both drive and control circuitry, a bootstrap function may be employed, so as to facilitate providing an adequate supply of the driving stage of the power devices.

These types of systems may use a high-voltage LDMOS transistor, instead of a PN junction, for implementing the bootstrap diode in order to facilitate a fast switching behavior of the OUT terminal.

In certain implementations an integrated LDMOS transistor may provide a bootstrap diode behavior. For instance the LDMOS gate and source terminals may be common (i.e., short circuited to each other) and connected to an external voltage supply. Such topology facilitates obtaining a unidirectional current path from the source to the drain terminals of the LDMOS with VGS kept at zero V and with a sophisticated body terminal polarization circuitry provided in order to avoid the triggering of the intrinsic bipolar transistors integrated in the LDMOS structure during the fast swing of the drain terminal.

A drawback of this approach may lie in the forward voltage drop of the equivalent diode between the VCC and BOOT pins. This may be higher than 1V, since the forward voltage drop of the equivalent diode may be equal to the threshold voltage of the LDMOS, which is a function of process parameters and the positive voltage drop between LDMOS source and body terminals. The structure presented in U.S. Pat. No. 6,075,391 A (already cited) may be adopted in order to control the high-voltage LDMOS by avoiding the triggering of the intrinsic bipolar transistors and reducing the forward voltage drop of the equivalent diode.

In that case, a driving voltage for the gate of the integrated LDMOS may be obtained from a VCC source voltage by means of a charging pump, in order to turn-on the LDMOS when the low-side power device is turned on and then the OUT pin (output terminal) is about zero Volt. A Zener diode set between the source terminal and the external low-side voltage supply may protect the LDMOS body-source junction and inhibit the current path from the integrated LDMOS transistor drain to the supply node VCC in various conditions. This inverse current may damage the device or in any case discharge the bootstrap capacitor. Finally, an appropriate polarization circuit for the body terminal may be used in order to avoid triggering the intrinsic bipolar transistors integrated in the LDMOS structure.

A drawback of this approach may lie in the complexity of the LDMOS turn-off circuit and in the high area consumption of the LDMOS gate terminal control circuit due to the presence of a rather cumbersome charge pump capacitor. For instance, such an architecture may exhibit an equivalent diode forward voltage drop between the VCC and bootstrap pins of about 700 mV (as an ideal diode) only when a low side control signal is high and for a finite amount of time, due to the charge pump gate control circuit limitations.

It was observed that the continuing improvement of SiC and GaN power device technology and stringent constrains in terms of minimum voltage supplies for the driving stages, e.g., 5V or below, may suggest to reduce drastically the forward voltage drop of the equivalent integrated diode connected between the VCC and (BOOT) pins.

Figure 2:
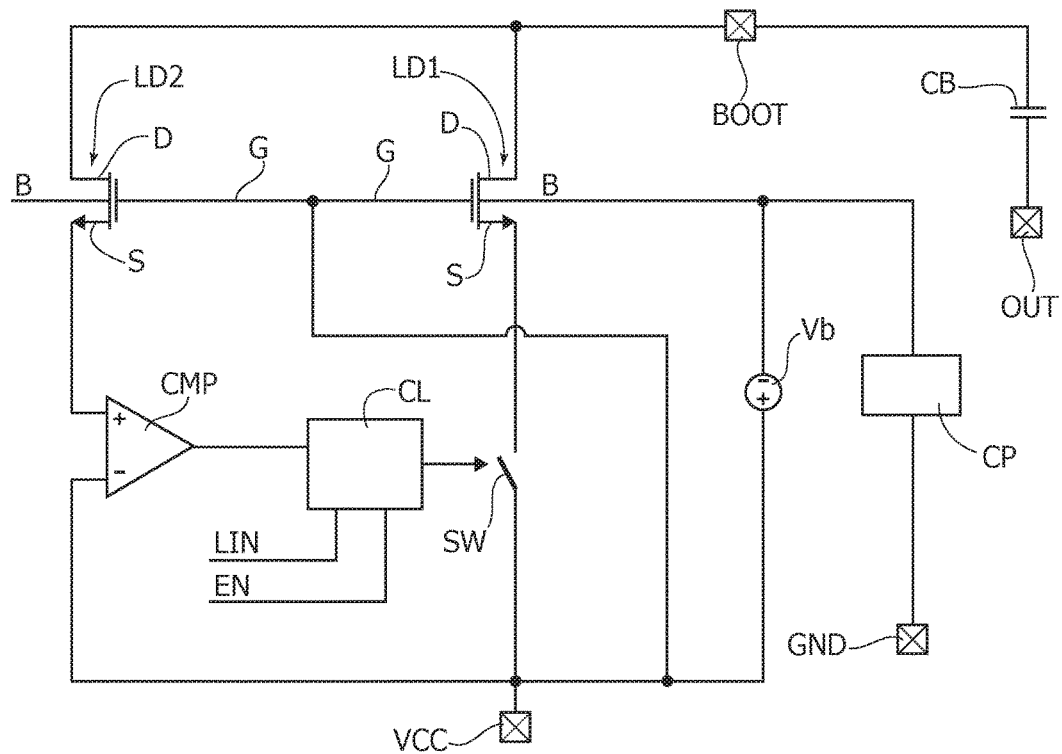
FIG. 2 is a block diagram of a driver circuit according to one or more embodiments of the present disclosure.

One or more embodiments as exemplified in FIG. 2 may address the problem of the appreciable voltage difference between VCC and VBO (notionally the voltage across the diode DB in steady state conditions) by preserving area occupation, in order to overcome limitations for a high-voltage gate driver IC development.

The same references have been used in FIG. 2 in order to designate parts and elements already introduced in connection with FIG. 1. A corresponding description will not be repeated here for the sake of brevity; this may apply to the fact that the two switches (e.g., transistors) PW1, PW2 may be controlled "diametrically" (that is switched on and off alternatively) so that they are not turned on, that is made conductive, at the same time.

In one or more embodiments as exemplified in FIG. 2, the bootstrap diode DB of FIG. 1 between the VCC and BOOT pins of the IC may be replaced by a diode-like conductive path provided via two high-voltage, e.g., depletion LDMOS transistors LD1, LD2 as detailed in the following. In one or more embodiments, these transistors may be integrated in an isolating well pocket which may sustain the high voltage stress between the high voltage supply and the ground potential, e.g., of the integrated circuit.

FIG. 2 is thus exemplary of one or more embodiments of a circuit for providing a high-voltage, low (forward voltage) drop diode-like conductive path between a DC voltage supply terminal VCC and a bootstrap terminal BOOT in charging a supply capacitor CB for driving (e.g., at HS_DRV) a power switch such as PW1 with the capacitor CB set between the bootstrap terminal BOOT and an output terminal OUT, with the output terminal OUT alternatively switchable (e.g., via PW1 and PW2) between a low voltage such as GND and a high voltage DC voltage such as HV rail.

In one or more embodiments as exemplified in FIG. 2, an equivalent bootstrap diode circuit may include a high-voltage, e.g., LDMOS depletion transistor LD1, which may act as a high voltage cascode device, as well as a second high-voltage, e.g., LDMOS depletion transistor LD2, which may act as decoupler transistor between the high voltage BOOT terminal and the low voltage sense comparator CMP.

In one or more embodiments, the transistors LD1 and LD2 may have common gates G (control terminals), bodies B and drains D (that is common coupling terminals to the bootstrap terminal BOOT).

In one or more embodiments, the two transistors LD1 and LD2 may have different source (that is current emitter) terminals.

In one or more embodiments, the drains of LD1 and LD2 may be coupled with the high-side supply node BOOT, while the gates may be coupled with the low-side supply node VCC.

In one or more embodiments, a body polarization circuit, coupled with the bodies of the transistors may be provided, e.g., in order to avoid undesired switch-on of the LDMOS intrinsic bipolar transistors in various applicative conditions.

In one or more embodiments, the source of LD1 may be coupled with the low-side supply node VCC by means of a low-voltage switch SW set between the DC voltage supply VCC and the source terminal of LD1.

In one or more embodiments, the source of LD2 may be coupled with the non-inverting input of a low voltage comparator CMP whose inverting input is coupled with VCC.

In one or more embodiments, a control logic CL may turn on the low voltage switch SW (only) when the low-side power device (PW2 in FIG. 1) is turned on and when the BOOT voltage is lower than the VCC voltage supply, as sensed by the low voltage comparator CMP through the high-voltage depletion LDMOS transistor LD2, which has the function of decoupler from high voltage.

In one or more embodiments, inputs to the control logic CL may include the low-side control signal LIN (see also FIG. 1) and an enable signal EN with the purpose of placing the diode in safe conditions.

In one or more embodiments, the first and second transistors LD1, LD2 may have their bodies B coupled with a body polarization circuit Vb to counter switch-on of the intrinsic bipolar transistors therein.

In one or more embodiments a clamp member CP may be set between the body of LD1 (common to LD2) and ground GND.

Figure 3:
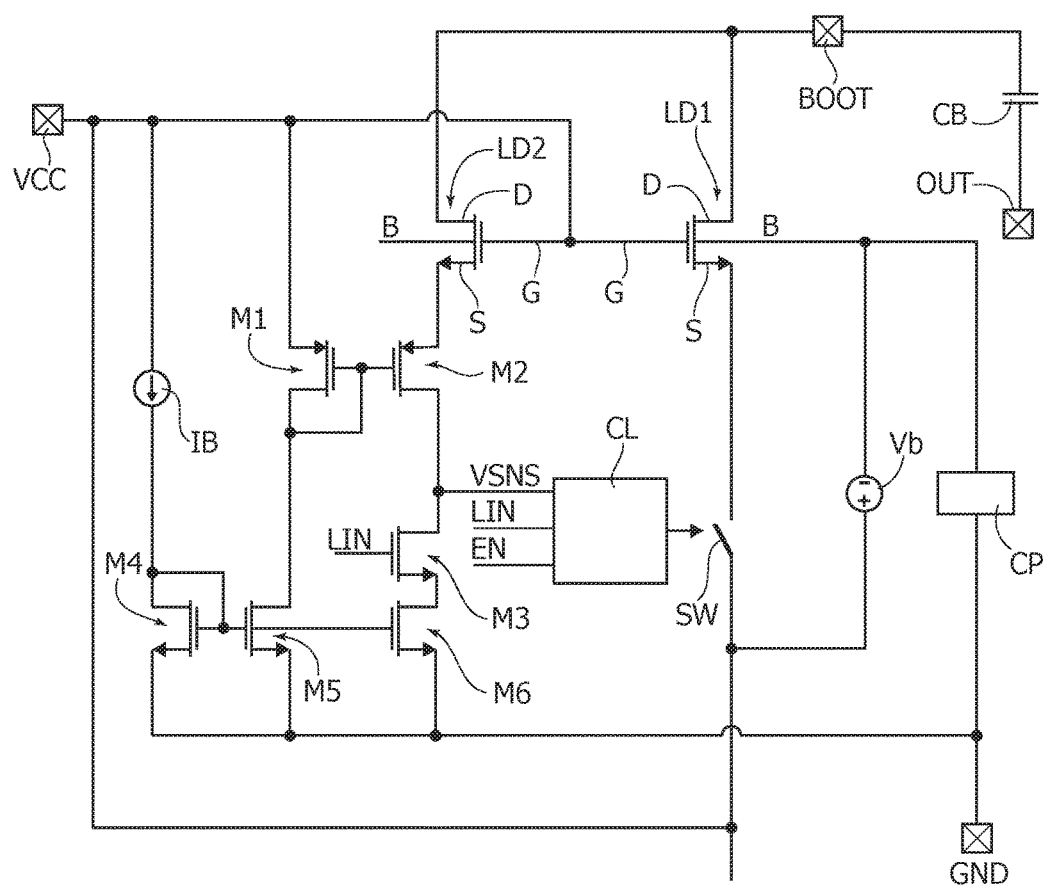
FIG. 3 is an exemplary circuit diagram of a driver circuit according to one or more embodiments of the present disclosure.

The diagram of FIG. 3, where the same references have been used in order to designate parts and elements already introduced in connections with FIG. 1 and FIG. 2, shows various low-voltage transistors M1-M6 used to provide a possible implementation for a LD2 source voltage terminal and a VCC voltage supply comparator CMP.

In a possible implementation, the comparator CMP of FIG. 2 may be realized by means of a common-gate differential pair (M1 and M2) with current generators (M4, M5 and M6—current IB) and an enable switch M3 driven by the low-side control signal LIN in order to reduce the current consumption between the BOOT and GND pins.

In one or more embodiments, when the low side control signal LIN (see also FIG. 1) is high (with the signal EN in AND with LIN), the comparator CMP is enabled (e.g., with the signal EN and the signal LIN being and-combined) and a VSNS signal between the drains of M2 and M3 will become low only when the BOOT voltage terminal and then the LD2 source voltage terminal are lower than the VCC voltage supply.

In one or more embodiments, with LIN high and VSNS low, the switch SW may activate a bidirectional current path between the VCC and BOOT pins, leading to VCC =VBOOT. In these operating conditions, the equivalent structure between the VCC and BOOT pins is essentially a resistor.

Otherwise, the switch SW may be opened with the current path between BOOT and VCC automatically inhibited, which may facilitate avoiding damages to the IC and preserving the charge stored in the bootstrap capacitor CB.

With the switch SW open, a unidirectional current path between the VCC and BOOT pins may be still provided by means of the intrinsic diode of the switch SW, even if the low-side Power Device (PW2 in FIG. 1) is turned off. In that condition, the forward voltage drop of the equivalent diode between VCC and BOOT pins is about 700 mV.

In one or more embodiments, a circuit architecture as exemplified herein may have a low (forward) voltage drop diode behavior between VCC and BOOT pins in various operating conditions.

In one or more embodiments, the possibility of integrating in a same isolating well pocket a high-voltage depletion LDMOS to sense the BOOT pin may enable to reduce to zero the voltage drop between VCC and VBO at the end of the charging phase of the bootstrap capacitance CB.

Figure 4:
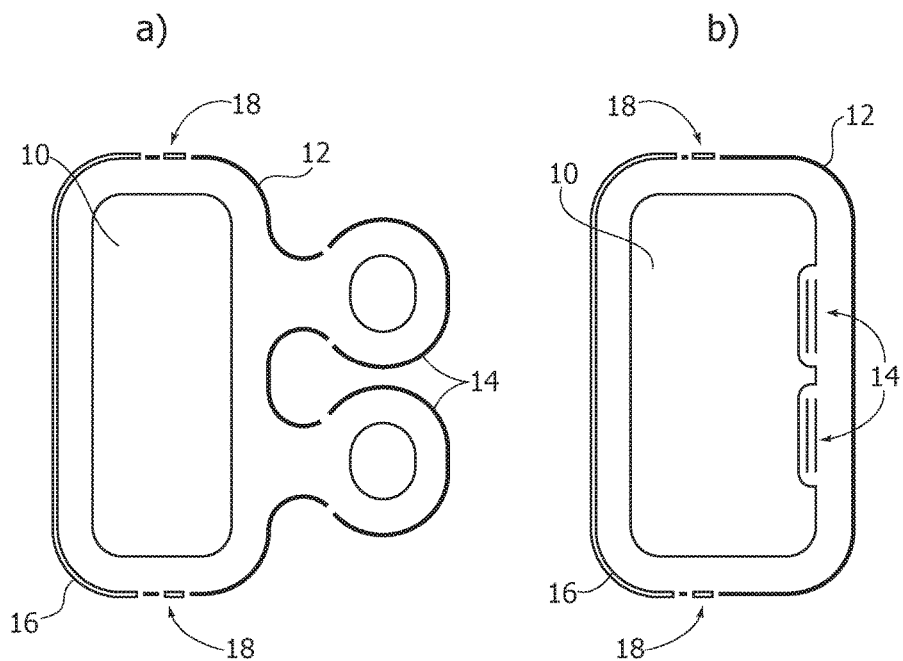
FIGS. 4 and 5 are exemplary of the possible integration of one or more embodiments in an integrated semiconductor device.
Figure 5:
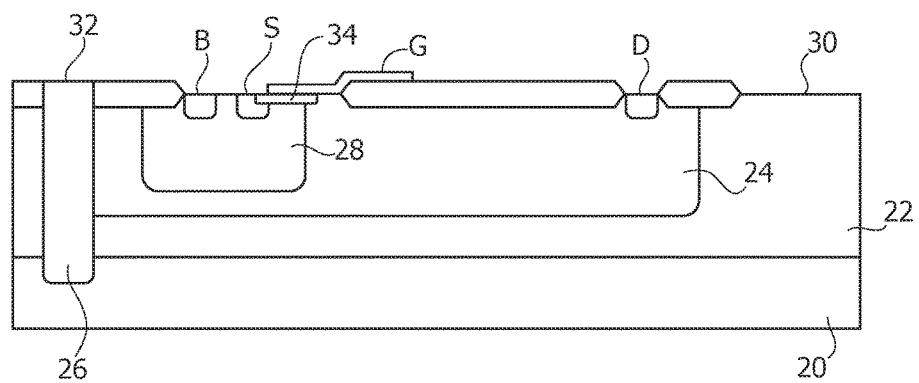

In one or more embodiments, a high-voltage depletion MOS may be integrated in the same isolation ring of the HV Floating Pocket as schematically illustrated in FIGS. 4 and 5.

FIG. 4 includes two portions, designated a) and b) exemplary of possible implementations of high-voltage (HV) floating wells with and integrated high-voltage depletion MOS.

FIG. 5 is a cross sectional view along the lines V-V' in (both portions of) FIG. 4.

In the portions of FIG. 4, the following designations apply:
10: floating pocket
12: high-voltage isolation
14: level shifter
16: depletion MOS
18: sense depletion MOS.
In FIG. 5, the following designations apply:
20: P substrate
22: N epitaxy
24: high-voltage N well
26: P+ isolation
28: P well
30: floating well
32: substrate
34: N depletion
S: source
D: drain
G: gate
B: body.

In one or more embodiments, a N-depletion implant 34 may establish a conduction path for electrons between the drain D (N+/HVWELL) and the source S (N+). This conduction path can be inhibited with a proper polarization of the gate G, lower than the source S.

Both the depletion MOS 16 to charge the bootstrap capacitor CB and the sense depletion MOS 18 acting as a decoupler transistor between the BOOT voltage and the low voltage sense circuitry may be integrated. The drains of these two depletion MOS's may be shared and physically connected to the floating pocket 10. The threshold voltages of the two depletion MOS's 16, 18 may be aligned by construction.

One or more embodiments may thus be used in the place of a diode (e.g., DB in FIG. 1) in order to provide a high-voltage low-drop diode-like conductive path between a DC voltage supply terminal and a bootstrap terminal in charging a supply capacitor for driving a power switch with the capacitor set between the bootstrap terminal and an output terminal alternatively switchable between a low voltage (e.g., GND) and a high voltage DC voltage (e.g., HV rail).

In one or more embodiments, the circuit may include first and second transistors (e.g., LD1, LD2) with the first transistor set in a cascode arrangement between the bootstrap terminal and the DC voltage supply terminal and the second transistor coupled between the BOOT terminal and a (low-voltage) sense comparator (e.g., CMP), with said sense comparator set between the second transistor (LD2) and said DC voltage supply terminal (VCC).

In one or more embodiments, the first and second transistors may have common control terminals (e.g., gates G) coupled with the DC voltage supply terminal and common coupling terminals (e.g., drains D) to the bootstrap terminal.

In one or more embodiments, the first and second transistors may have common bodies.

In one or more embodiments, the first transistor may have a source (that is, current emitter) terminal coupled with the low voltage DC voltage supply terminal via a switch, the switch activatable when the terminal (e.g., the drain) of the first transistor coupled to bootstrap terminal is low compared to the DC voltage supply terminal.

In one or more embodiments, a comparator may be provided for comparing the voltage at the bootstrap terminal by means of the second transistor with the voltage at the DC low voltage supply terminal and activating the switch as a function of the comparison.

In one or more embodiments, the first and second transistors may include depletion transistors.

In one or more embodiments, the first and second transistors may include MOS transistors, optionally LDMOS transistors.

In one or more embodiments, the first and second transistors may include LDMOS depletion transistors.

In one or more embodiments, the first and second transistors may have their bodies (e.g., B) coupled with a body polarization circuit to counter switch-on of the intrinsic bipolar transistors therein.

In one or more embodiments, the first and second transistors may be integrated in an isolating well pocket of an integrated semiconductor circuit.

In one or more embodiments, a device such as, e.g., a half-bridge switching device, may include:
a capacitor for driving a power switch (e.g., PW1) with the capacitor set between a bootstrap terminal and an output terminal alternatively switchable between a low voltage (e.g., GND) and a high voltage DC voltage (e.g., HV rail),
a driver circuit according to one or more embodiments for providing a high-voltage low-drop diode-like conductive path between a DC voltage supply terminal and the bootstrap terminal in charging the supply capacitor.

One or more embodiments may include a further power switch (e.g., PW2) to switch the output terminal between a low voltage (e.g., GND) and a high voltage DC voltage (e.g., HV rail), with the power switch and the further power switch configured to be switched on and off alternatively (that is by avoiding that they may be both conductive at a same time).

Without prejudice to the underlying principles, the details and embodiments may vary, even significantly, with respect to what has been described by way of example only without departing from the extent of protection.

The extent of protection is defined by the annexed claims.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
first and second transistors with the first transistor couplable between a bootstrap terminal and a voltage supply terminal and the second transistor coupled between the bootstrap terminal and a sense node, the first and second transistors having common control terminals coupled with the voltage supply terminal and common coupling terminals coupled to the bootstrap terminal, the first and second transistors configured to provide a conductive path between the voltage supply terminal and the bootstrap terminal in charging a supply capacitor for driving a high-side power switch with the supply capacitor being coupled between the bootstrap terminal and an output terminal that is alternatively switchable between a low voltage and a high voltage; and
a sense comparator coupled between the second transistor and the sense node, the sense comparator configured to control coupling of the first transistor to the voltage supply terminal in response to a bootstrap voltage on the bootstrap terminal being less than a supply voltage on the voltage supply terminal and a low-side control signal being active to activate a low-side power switch, the sense comparator including:
a common-gate differential pair of transistors including first and second differential transistors, the first differential transistor coupled in series with a first current generating transistor between the sense node and a reference voltage terminal, and the second differential transistor being diode-coupled in series with a second current generating transistor between voltage supply terminal and the reference voltage terminal; and
a current source coupled in series with a third current generating transistor between the voltage supply terminal and the reference voltage terminal, the third current generating transistor being, diode-coupled and control nodes of each of the first, second and third current generating transistors being coupled together.

2. The driver circuit of claim 1, wherein the first and second transistors have common bodies.

3. The driver circuit of claim 1, wherein the first transistor has a current source terminal coupled with the voltage supply terminal via a switch, the switch activatable in response to a voltage on the terminal of the first transistor coupled to the bootstrap terminal being low compared to the supply voltage on the voltage supply terminal.

4. The driver circuit of claim 3, including said comparator is configured to compare the voltage at the bootstrap terminal via said second transistor with the supply voltage at said voltage supply terminal and to activate the switch as a function of said comparing.

5. The driver circuit of claim 1, wherein the first and second transistors include depletion transistors.

6. The driver circuit of claim 1, wherein the first and second transistors include MOS transistors.

7. The driver circuit of claim 6, wherein each of the MOS transistors comprises an LDMOS transistor.

8. The driver circuit of claim 6, wherein the first and second transistors have their bodies coupled with a body polarization circuit to counter switch-on of the intrinsic bipolar transistors therein.

9. An integrated semiconductor driver circuit, comprising:
a bootstrap node and an output node configured to have a supply capacitor coupled across the bootstrap and output nodes;
a supply voltage node configured to receive a supply voltage;
a high-side control signal node configured to receive a high-side control signal;
a low-side control signal node configured to receive a low-side control signal;
a high-side control node configured to be coupled to a control node of a high-side power transistor;
a low-side control node configured to be coupled to a control node of a low-side power transistor;
a load node configured to be coupled to an interconnection of the high-side and low side power transistors; and
a circuit configured to charge the supply capacitor, the driver circuit including,
a first transistor having a first signal node coupled to the bootstrap node and a second signal node, the first transistor having a control node coupled to the supply voltage node;
a second transistor having signal nodes coupled between the bootstrap node and a sense node, the second transistor having a control node coupled to the supply voltage node;
a sense comparator having a first input coupled to the sense node and a second input coupled to the supply voltage node, the sense comparator configured to control coupling of the second signal node of the first transistor to the supply voltage node based on a bootstrap voltage on the bootstrap node being less than a supply voltage on the supply voltage node and the low-side control signal being active; and
an isolating well pocket with the first and second transistors of the driver circuit integrated in the isolating well pocket.

10. The integrated semiconductor circuit of claim 9, wherein the sense comparator comprises:
first and second differential transistors coupled as a common-gate differential pair, the first differential transistor coupled in series with an enable transistor and a first current generating transistor between the sense node and a reference voltage node, and the second differential transistor being diode-coupled in series with a second current generating transistor between the supply voltage node and the reference voltage node; and
a current source coupled in series with a third current generating transistor between the bootstrap node and the reference voltage node, the third current generating transistor being diode-coupled and control nodes of each of the first, second and third current generating transistors being coupled together.

11. The integrated semiconductor circuit of claim 9, wherein each of the first and second transistors comprises an LDMOS depletion transistor.

12. A device, comprising:
a capacitor for driving a power switch with the capacitor coupled between a bootstrap terminal and an output terminal alternatively switchable between a low voltage and a high voltage DC voltage,
a driver circuit coupled to a supply voltage terminal and the bootstrap terminal and configured to charge the capacitor, the driver circuit including,
a first transistor having a first signal node coupled to the bootstrap terminal and a second signal node configured to be coupled to the supply voltage terminal, the first transistor having a control node coupled to the supply voltage terminal;
a second transistor having signal nodes coupled between the bootstrap terminal and a sense node, the second transistor having a control node coupled to the supply voltage terminal;
a sense comparator having a first input coupled to the sense node and a second input coupled to the supply voltage terminal, the sense comparator including:
first and second differential transistors coupled as a common-gate differential pair, the first differential transistor coupled in series with an enable transistor and a first current generating transistor between the sense node and a reference voltage node, and the second differential transistor being diode-coupled in series with a second current generating transistor between the supply voltage node and the reference voltage node; and
a current source coupled in series with a third current generating transistor between the bootstrap node and the reference voltage node, the third current generating transistor being diode-coupled and control nodes of each of the first, second and third current generating transistors being coupled together; and
a half-bridge switching device coupled to the driver circuit, the half-bridge switching device including the first power switch and a second power switch coupled in series with the first power switch.

13. The device of claim 12, wherein the second power switch is configured to switch the output terminal between said low voltage and said high voltage DC voltage, said first power switch and said second power switch configured to be switched on and off alternatively.

14. The device of claim 9, wherein each of the first and second power switches comprises a power transistor.

15. The device of claim 14, wherein each power transistor comprises one of a MOSFET, IGBT, FET and GaN type transistor.

16. The device of claim 15, wherein each power transistor comprises a power MOS transistor and the power MOS transistors have common bodies.

17. The device of claim 16, wherein each of the power MOS transistors comprises an LDMOS transistor.

18. The device of claim 17, wherein each of the LDMOS transistors comprises an LDMOS depletion transistor.

19. The device of claim 12, wherein the first transistor is coupled through a switch to the DC voltage supply terminal, the sense comparator coupled to the switch and configured to activate the switch responsive to a voltage on the bootstrap terminal being low relative to a voltage on the DC voltage supply terminal.

20. The device of claim 12, wherein each of the first and second transistors comprises a MOS transistor, each MOS transistor having a body and the body being coupled to counter a switching-on of an intrinsic bipolar transistor of the MOS transistor.

* * * * *